(12) United States Patent
Gaidis et al.

(10) Patent No.: US 8,023,305 B2
(45) Date of Patent: *Sep. 20, 2011

(54) HIGH DENSITY PLANAR MAGNETIC DOMAIN WALL MEMORY APPARATUS

(75) Inventors: Michael C. Gaidis, Wappingers Falls, NY (US); Lawrence A. Clevenger, LaGrangeville, NY (US); Timothy J. Dalton, Ridgefield, CT (US); John K. DeBrosse, Colchester, VT (US); Louis L. C. Hsu, Fishkill, NY (US); Carl Radens, LaGrangeville, NY (US); Keith Kwong-Hon Wong, Wappingers Falls, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 743 days.

This patent is subject to a terminal disclaimer.

(21) Appl. No.: 12/136,091

(22) Filed: Jun. 10, 2008

(65) Prior Publication Data

US 2008/0239784 A1    Oct. 2, 2008

Related U.S. Application Data

(63) Continuation of application No. 11/694,183, filed on Mar. 30, 2007, now Pat. No. 7,514,271.

(51) Int. Cl.
*G11C 19/02* (2006.01)
*G11C 19/08* (2006.01)

(52) U.S. Cl. .............. 365/80; 365/81; 365/85; 365/87

(58) Field of Classification Search .......... 365/80, 365/81, 85, 87

See application file for complete search history.

(56) References Cited

U.S. PATENT DOCUMENTS

| | | |
|---|---|---|
| 5,583,727 A | 12/1996 | Parkin |
| 5,598,308 A | 1/1997 | Dieny et al. |
| 6,473,328 B1 | 10/2002 | Mercaldi |
| 6,518,588 B1 | 2/2003 | Parkin et al. |
| 6,529,404 B2 | 3/2003 | Hidaka |
| 6,538,919 B1 | 3/2003 | Abraham et al. |
| 6,608,776 B2 | 8/2003 | Hidaka |
| 6,778,430 B2 | 8/2004 | Hidaka |
| 6,834,005 B1 | 12/2004 | Parkin |
| 6,898,132 B2 | 5/2005 | Parkin |
| 6,920,062 B2 | 7/2005 | Parkin |
| 6,927,073 B2 | 8/2005 | Huggins |
| 7,514,271 B2 | 4/2009 | Gaidis et al. |
| 2004/0196705 A1 | 10/2004 | Ishikura et al. |
| 2004/0252538 A1 | 12/2004 | Parkin |
| 2005/0078509 A1 | 4/2005 | Parkin |
| 2005/0094427 A1 | 5/2005 | Parkin |
| 2008/0080234 A1 | 4/2008 | Iwata et al. |

OTHER PUBLICATIONS

U.S. Appl. No. 12/136,089; Notice of Allowance; Date Filed: Jun. 10, 2008; Date Mailed: Apr. 28, 2011. PCT Search Report—PCT/US 07/24798.

*Primary Examiner* — Evan Pert
(74) *Attorney, Agent, or Firm* — Cantor Colburn LLP; Louis J. Percello

(57) ABSTRACT

A magnetic domain wall memory apparatus with write/read capability includes a plurality of coplanar shift register structures each comprising an elongated track formed from a ferromagnetic material having a plurality of magnetic domains therein, the shift register structures further having a plurality of discontinuities therein to facilitate domain wall location; a magnetic read element associated with each of the shift register structures; and a magnetic write element associated with each of the shift register structures, the magnetic write element further comprising a single write wire having a longitudinal axis substantially orthogonal to a longitudinal axis of each of the coplanar shift register structures.

10 Claims, 12 Drawing Sheets

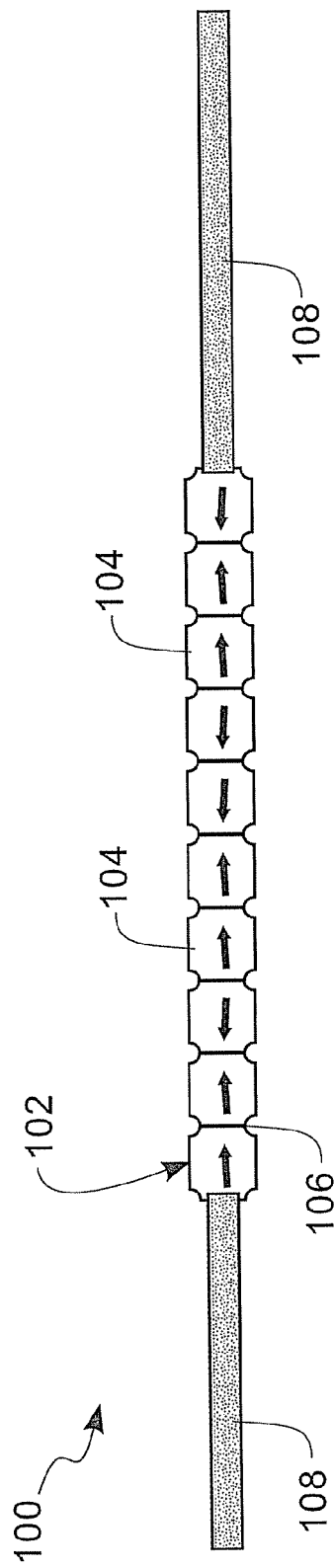
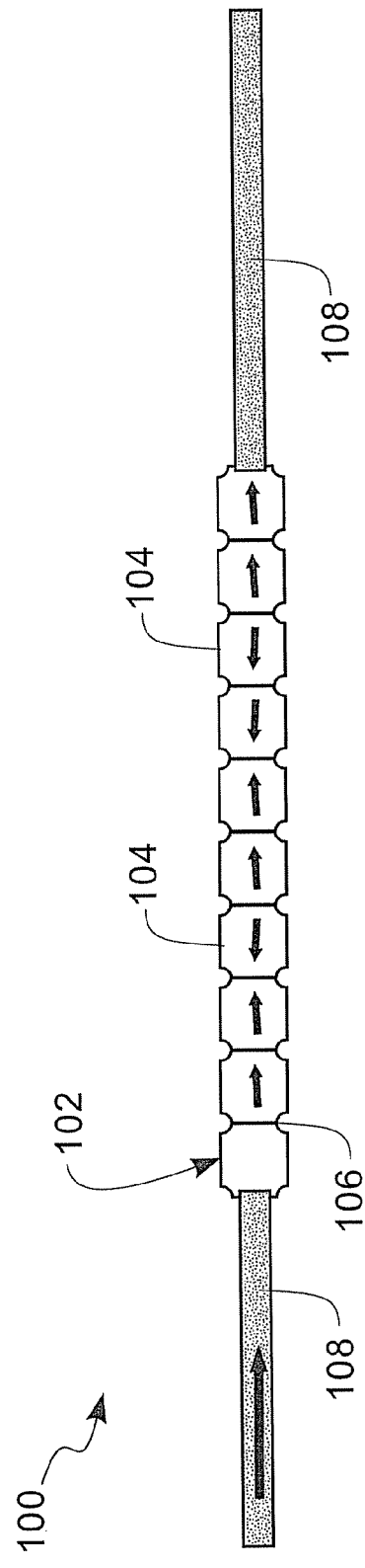

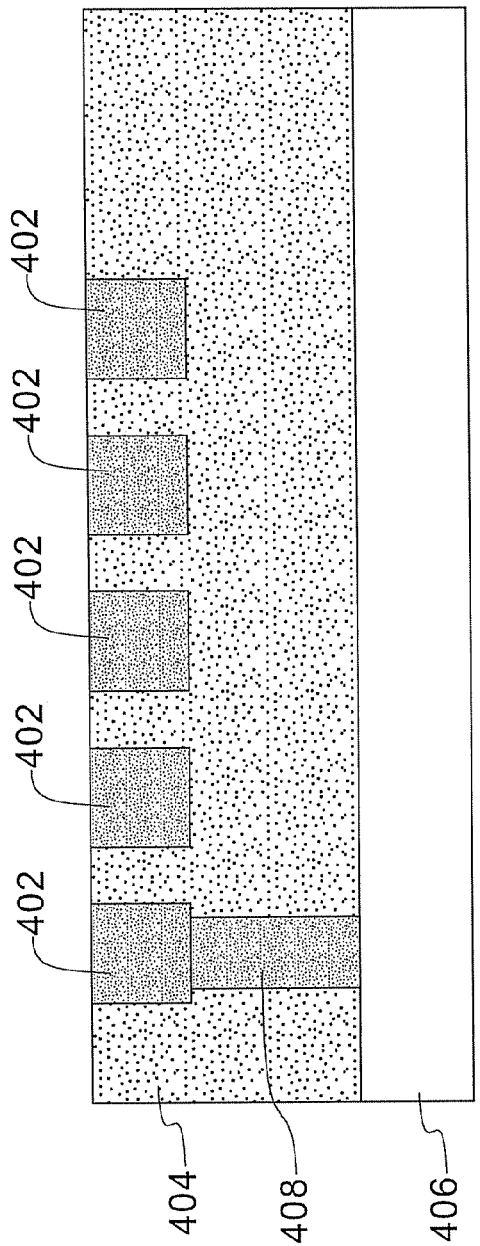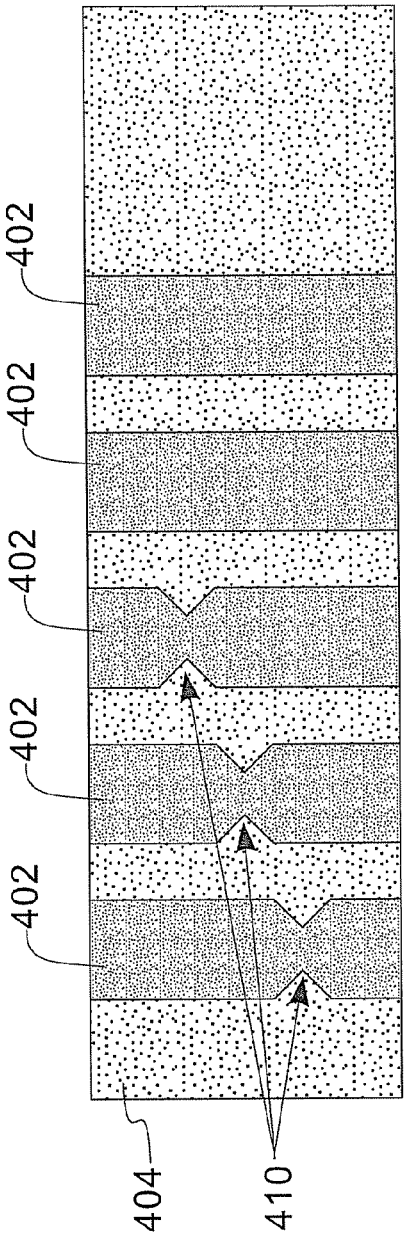
FIG. 4A
FIG. 4B

B-B

C-C

HIGH DENSITY PLANAR MAGNETIC DOMAIN WALL MEMORY APPARATUS

CROSS-REFERENCE TO RELATED APPLICATION

This application is a continuation of U.S. patent application Ser. No. 11/694,183, filed Mar. 30, 2007, the disclosure of which is incorporated by reference herein in its entirety.

FIELD OF THE INVENTION

The present invention relates generally to memory storage devices and, more particularly, to a high-density, planar magnetic domain wall memory apparatus.

Dynamic Random Access Memory (DRAM) integrated circuit arrays have been in existence for several years, with their dramatic increase in storage capacity having been achieved through advances in semiconductor fabrication technology and circuit design technology. The considerable advances in these two technologies have also resulted in higher and higher levels of integration that permit dramatic reductions in memory array size and cost, as well as increased process yield.

A DRAM memory cell typically includes, as basic components, an access transistor (switch) and a capacitor for storing a binary data bit in the form of a charge. Typically, a first voltage is stored on the capacitor to represent a logic HIGH or binary "1" value (e.g., $V_{DD}$), while a second voltage on the storage capacitor represents a logic LOW or binary "0" value (e.g., ground). A basic drawback of a DRAM device is that the charge on the capacitor eventually leaks away and therefore provisions must be made to "refresh" the capacitor charge, otherwise the data bit stored by the memory cell is lost.

The memory cell of a conventional Static Random Access Memory (SRAM), on the other hand, includes, as basic components, an access transistor or transistors and a memory element in the form of two or more integrated circuit devices interconnected to function as a bistable latch. An example of such a bistable latch is a pair of cross-coupled inverters. Bistable latches do not need to be "refreshed," as in the case of DRAM memory cells, and will reliably store a data bit indefinitely so long as they continue to receive supply voltage. However, such a memory cell requires a larger number of transistors and therefore a larger area of silicon real estate than a simple DRAM cell, and draws more power than a DRAM cell. Like a DRAM array, an SRAM array is also a form of volatile memory in that the data is lost once power is removed.

Accordingly, efforts continue to identify other types of memory elements that are capable of storing data states, that do not require extensive refreshing, and that are non-volatile in nature. For example, certain types of magnetic memories have evolved that offer storage at an extremely low cost-per-bit, but generally suffer from performance that is not competitive with semiconductor memories such as SRAM or DRAM. Presently, there is considerable effort in the field of magnetics to bring the large and slow (but inexpensive) magnetic memory technologies like hard drives and the less commercially successful "bubble memory" devices into a higher performance realm, where it may replace SRAM or DRAM for certain applications. "Bubble memory" refers to the storage of information in a linear series of "bubbles" of magnetization on a tape of magnetic material. Through judicious application of magnetic fields to this fixed tape, the bubbles are made to move or shift along the tape as in a shift register. By locating a read element at one position along the tape, it is possible to read out the state of the individual bits as they are shifted along by the external magnetic field.

However, the initial concept of the bubble memory was slow to commercialize for at least two reasons. First, it relied on the use of external fields for shifting the magnetic bits, which is typically a very slow, "power hungry" process, and is more suited for operation on a macroscopic scale (e.g., the efficiency is greater if the entire plane shifts together, rather than shifting individual, small arrays of bits). Second, the macroscopic nature of conventional bubble memory implies that if there is a single defect in the "shift-register" track, then an exceedingly large number of bits will be rendered unusable. Moreover, redundancy and fusing schemes for yield improvement are therefore very expensive or impractical.

More recent developments in the field of spintronics have made a certain type of microscopic memory possible, one having close similarities with respect to the "macroscopic" bubble memory. This concept involves the use of "domain walls" as the mechanism for storage of information, with such domain walls being located within microscopic (nanoscale) wires of magnetic material. The physics underlying the domain wall memory concept are manifested through a local, microscopic means of shifting the bits along a shift register track. By flowing a sufficiently large spin-polarized current along the nanowire, enough force is imparted from the electrons onto the domain walls such that the domain walls may be moved along the wire. In addition, certain techniques are used to pin the domain walls at regular locations along the wire for simple, reliable readout of the information by a small number of read elements for many bits of information.

A key aspect for creating a practical, useful memory in this manner is that the shift register tracks may be made quite small, and may be shifted locally, rather than with a global external magnetic field. This provides a bridge between the speed of random access memory (single-bit storage) and the high density (and low cost) of shift registers. Through the use of domain wall memory, a plurality of small shift registers may be configured in an array fashion on a circuit. This provides the capability of addressing and shifting each bit individually for maximum flexibility, while at the same time packing large densities of bit storage into the miniscule nanowires. In addition, the shift registers may be made small enough so that a production failure of a given shift register can be recovered through the use of additional redundant shift registers, thus eliminating the need for perfect yield of all devices on a given circuit.

In summary, conventional bubble memory suffers from limitations with respect to speed, track density, and physical defects that are difficult to circumvent. Although the domain wall memory concepts described above offer solutions to the problems of bubble memory, such newly proposed domain wall memory concepts have, as a practical matter, been extremely complex and difficult to fabricate (e.g., 3-dimensional shift register structures). Accordingly, it would be desirable to be able to fabricate practical domain wall memory structures in a more cost-effective production environment.

SUMMARY

The foregoing discussed drawbacks and deficiencies of the prior art are overcome or alleviated by a magnetic domain wall memory apparatus with write/read capability. In an exemplary embodiment, the device includes a plurality of coplanar shift register structures each comprising an elongated track formed from a ferromagnetic material having a plurality of magnetic domains therein, the shift register structures further having a plurality of discontinuities therein to facilitate domain wall location; a magnetic read element associated with each of the shift register structures; and a magnetic write element associated with each of the shift register structures, the magnetic write element further comprising a single write wire having a longitudinal axis substantially orthogonal to a longitudinal axis of each of the coplanar shift register structures.

BRIEF DESCRIPTION OF THE DRAWINGS

Referring to the exemplary drawings wherein like elements are numbered alike in the several Figures:

FIGS. 1(a) and 1(b) are schematic top views of an existing, single magnetic domain wall shift register;

FIGS. 4(a) through 4(c) are a series of process flow steps illustrating a structure and method of forming write conductors for a high-density, planar magnetic domain wall memory device in accordance with an embodiment of the invention;

DETAILED DESCRIPTION

Figure 2:
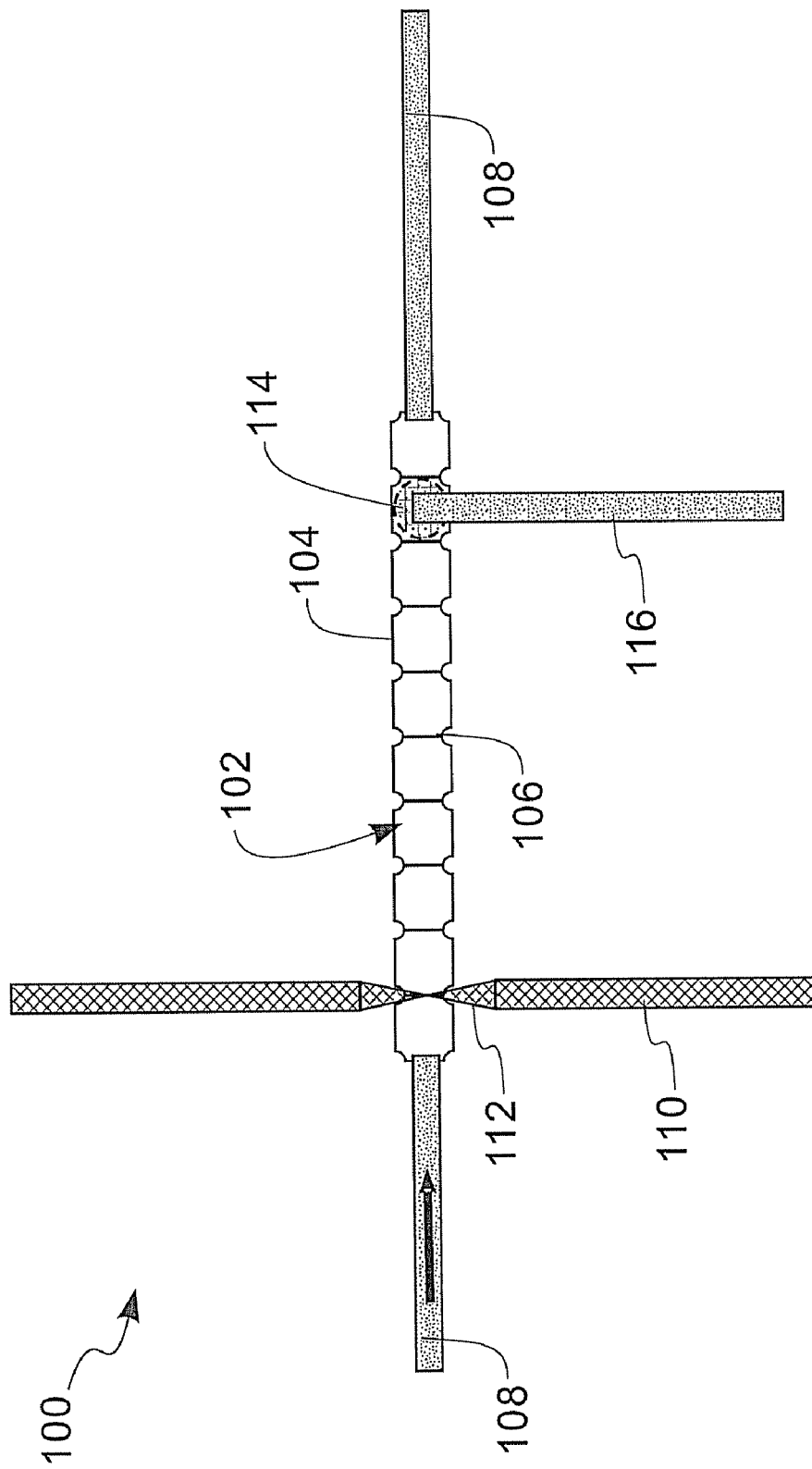
FIG. 2 is another top view of the shift register of FIGS. 1(a) and 1(b), further illustrating write and read elements.

Disclosed herein is a high-density, planar magnetic domain-wall memory structure having the additional advantages of speed and physical error-correction capability through, for example, redundancy and fusing. Briefly stated, multiple planar domain wall shift register tracks are formed through the use of existing semiconductor industry processing techniques. By staggering multiple, in plane shift registers, accommodations are made for multiple, in plane read and write conductors associated with the individual registers. Moreover, since the planar structure is concentrated in back-end-of-line (BEOL) structures that do not require extensive use of silicon transistors, one embodiment of the invention utilizes the layering of multiple such in-plane structures atop one other for extremely high-density memory arrays. Alternatively, the multiple, in plane shift registers may be aligned with one another so as to utilize a common write wire.

Referring initially to FIGS. 1(a) and 1(b), there is a schematic top view of a existing, single magnetic domain wall shift register structure 100, illustrating the general principle of memory storage and shifting. The shift register structure 100 comprises a thin track 102 made of a ferromagnetic material. The track 102 may be magnetized in small domains or sections 104, in one direction or another, as indicated by the arrows. Bits are stored within the track 102 based on the presence or absence of domain walls, which are located and detected at, for example, notches 106 in the thin magnetic track 102. However, other characteristics may also be used to define individual domain boundaries such as, for example, physical overlapping of magnetic segments, varying layer thicknesses (e.g., by partially etching back or partially plating up every other domain), or using alternating types of magnetic materials in the track 102. In other words, domain boundaries for storing individual bits can be formed by physical discontinuities (e.g., notches) or by material discontinuities.

Data within the register 100 is shifted through the application of current through a wire 108 connected at opposite ends of the track 102, as more particularly illustrated in FIG. 1(b). Depending upon the duration of the applied polarized electron current, a force is imparted that is capable of shifting the domain walls from one notch to an adjacent notch. In the example depicted in FIG. 1(b), the direction of the applied current causes the data to shift one position to the right. Unless measures are taken to capture the data (the data at the rightmost domain is shifted off the track 102), that bit will be lost.

FIG. 2 is another top view of the shift register 100 of FIGS. 1(a) and 1(b), further illustrating write and read elements. In particular, a write element positioned at one end of the shift register 100 includes a conductor or wire 110 having a constriction 112 (i.e., a narrow portion) formed therein corresponding to a domain 104 or a domain boundary (notches 106). Although FIG. 2 shows the write wire 110 positioned beneath a domain boundary, it will be noted that the wire may also be positioned beneath a domain instead. The write element wire 110 carries a current orthogonal to the magnetic memory element, with the resulting magnetic field being magnified at the constriction 112 in order to facilitate writing of the domain wall.

In addition, a read element 114 is positioned at the opposite side of the shift register 102 with respect to the write element. In the example illustrated, the read element 114 is embodied by a magnetic tunnel junction (MTJ). As indicated above, in order to maintain data in the shift register 100, a closed-loop shift register may be created by feeding back "read" data to the write element as the data in the shift register 102 is shifted by the application of current through wire 108. A read wire 116 is also coupled to the MTJ 114.

Figure 3:
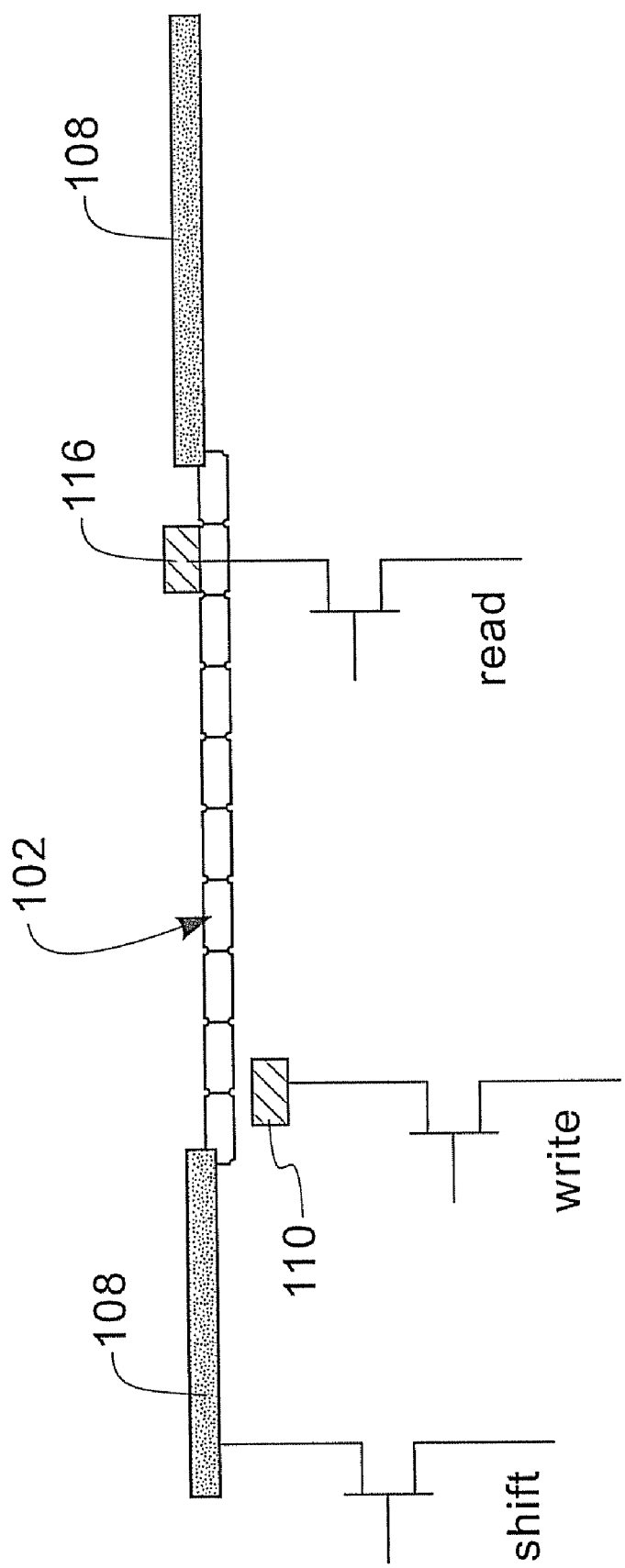
FIG. 3 is a schematic cross-sectional view of the shift register of FIG. 2, depicting front-end CMOS control circuitry.

FIG. 3 is a schematic cross-sectional view of the shift register 100 of FIG. 2, particularly illustrating connections to the front-end CMOS shift, read and write control circuitry. Because at most three transistors are needed for the entire shift register, the memory is heavily BEOL-loaded, and stacking of multiple structures could be employed to density the memory without using up all the silicon real estate beneath. However, in terms of a single plane, a problem exists with regard to forming multiple, co-planar shift registers as a result of the use of separate read and write wires for each.

Figure 4C:
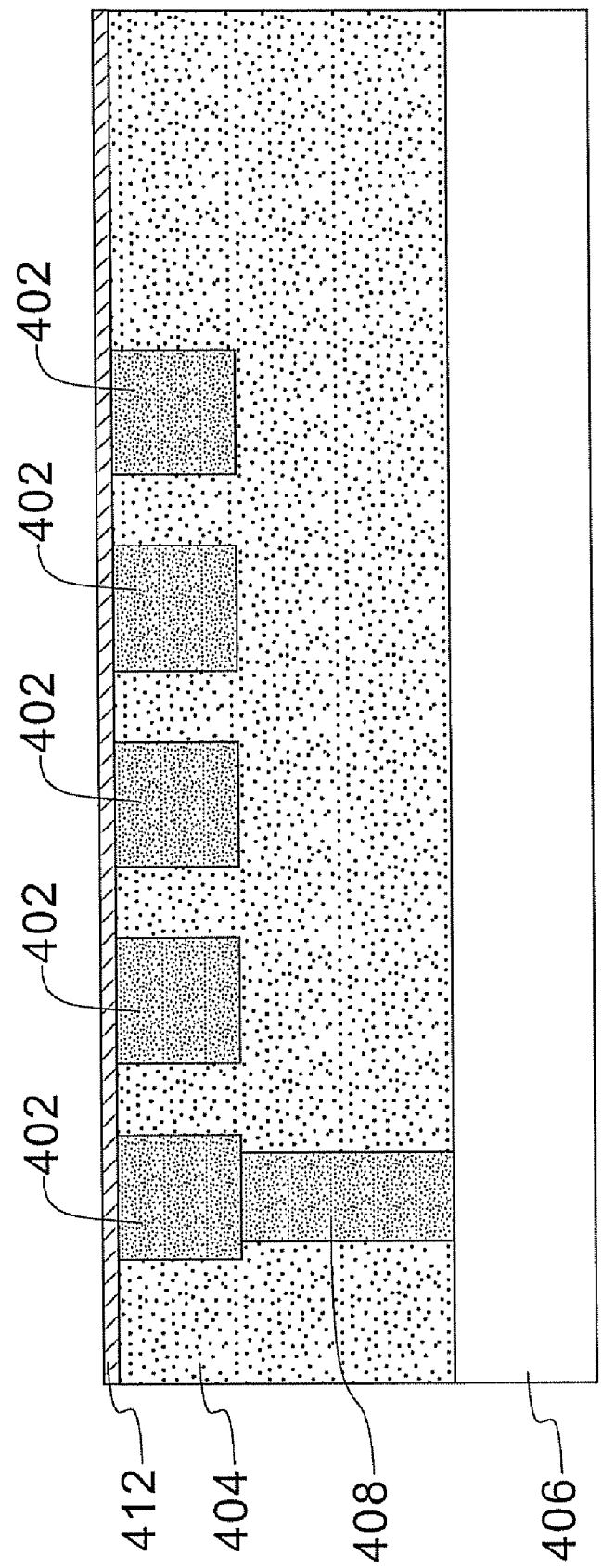

Accordingly, FIGS. 4(a) through 4(c) are a series of process flow steps illustrating a structure and method of forming write conductors for a high-density, planar magnetic domain wall memory device in accordance with an embodiment of the invention. As write wire efficiency is improved by proximity to the magnetic shift register element, the depicted embodiment is ideally suited for using a well-controlled, thin dielectric cap atop the write wires to accurately (and closely) space the ensuing magnetic film from the write wire without short circuiting.

As particularly shown in FIG. 4(a), a plurality of write wires 402 are formed in damascene fashion within an interlevel dielectric layer 404 above the silicon CMOS level 406 of a semiconductor device. Vias, such as via 408, are used to connect the write wires 402 to the associated switching transistors located on the silicon CMOS level 406. As shown in the top view of FIG. 4(b), the damascene write wire trenches are patterned with constrictions 410 at locations corresponding to the shift register in order to assist in magnetic field enhancement, thereby enabling domain wall formation in the register. Moreover, it will be noted that the constrictions 410 are staggered along a longitudinal direction of the write wires 402, with respect to one another, so as to allow multiple shift registers to be formed in the same horizontal wiring level.

In FIG. 4(c), a thin dielectric cap layer 412 is shown formed atop the write wires 402 and interlevel dielectric layer 404. The cap layer 412 forms a thin insulating barrier having good across-wafer uniformity, and at a well-known thickness. Through accurate control of the thickness of this film 412, the write wires may be positioned very closely to the magnetic film to be deposited above the cap layer 412, without danger of short circuits. Such close positioning will reduce the necessary current in the write wire needed to switch the magnetization state of the domain atop the write wire.

Referring now to FIGS. 5(a) through 5(i), there are shown are a series of process flow steps illustrating a structure and method of forming a high-density, planar magnetic domain wall memory device in accordance with a further embodiment of the invention. More specifically, FIGS. 5(a) through 5(i) illustrate the formation of the shift register element, the read element, and the wiring connections to the shift register element.

Figure 5A:
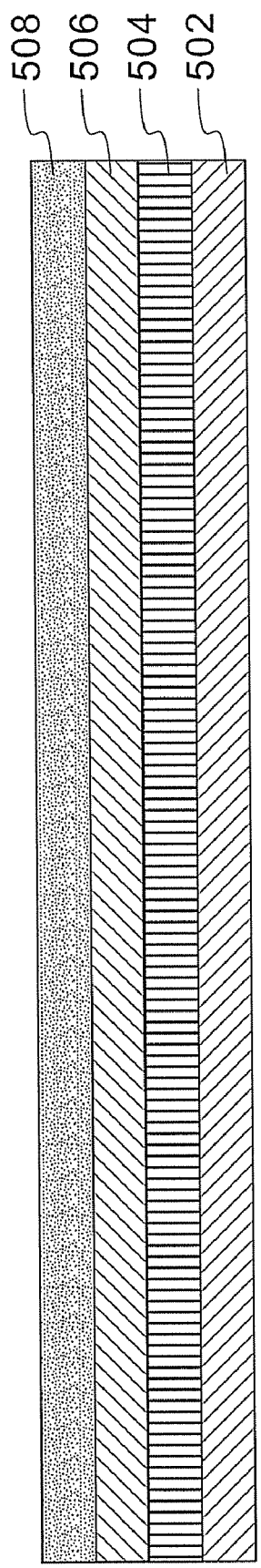
FIGS. 5(a) through 5(i) are a series of process flow steps illustrating a structure and method of forming a high-density, planar magnetic domain wall memory device in accordance with a further embodiment of the invention.

As shown in FIG. 5(a), a blanket stack of films are deposited atop the write wire/dielectric layer structure shown in FIG. 4(c). For purposes of clarity, the write wire/dielectric layer structure is not specifically illustrated in the FIG. 5 sequence. In the embodiment illustrated, the films correspond to materials used in a magnetic tunnel junction, although it will be appreciated that other layers may be used where a different read device is employed. For an MTJ device, the films include a free layer 502, a tunnel barrier 504 over the free layer 502, a pinned layer 506 over the tunnel barrier 504, and a cap layer 508. Specific materials used for the MTJ device layers may be in accordance with those known in the art.

Figure 5B:
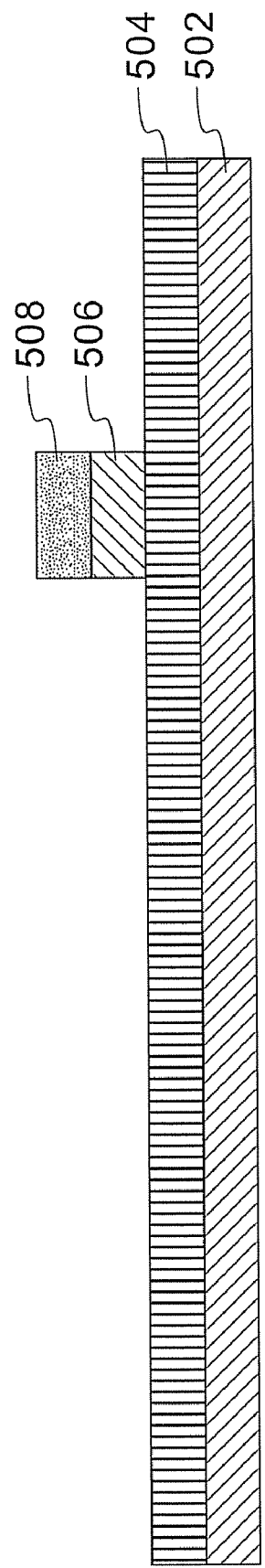
Figure 5C:
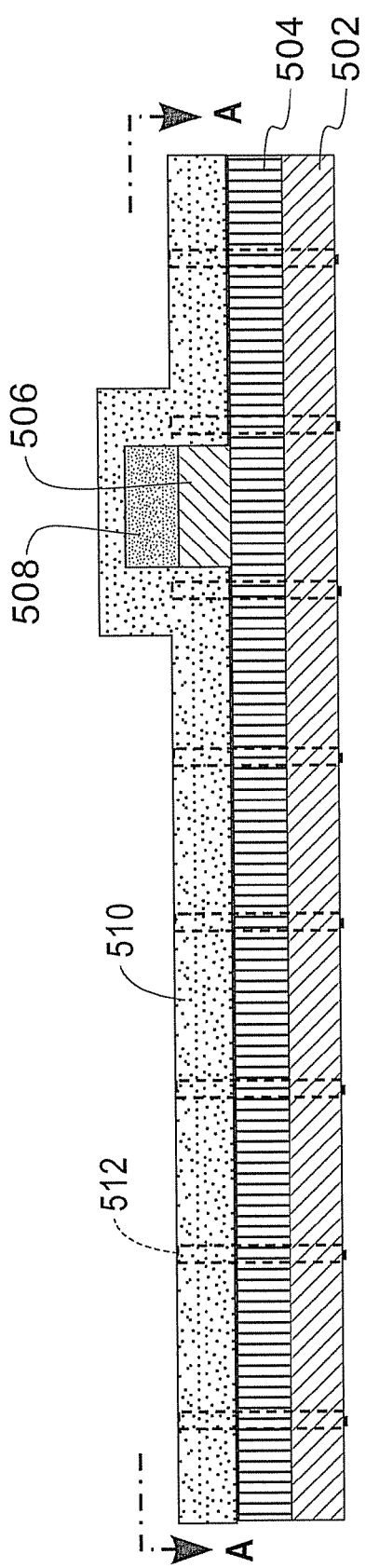

In FIG. 5(b), the cap and pinned layers 508, 506, are lithographically patterned and then etched to define an MTJ element, corresponding to a location near an end of the associated shift register. It will be noted that the tunnel barrier layer 504 and free layer 502 need not be etched for MTJ device formation. Then, in FIG. 5(c), an encapsulating layer 510 is formed over the device, followed by another lithographic patterning process to define the shift register, characterized by an elongated, track shape with discontinuities (e.g., notches 512) formed therein for domain wall location. The domain wall locating discontinuities may be created with the same photomask that defines the elongated track shape, or the discontinuities may alternatively be formed at an earlier stage using a technique other than notches. A top view of the shift register structure 514 formed in FIG. 5(c) is illustrated in FIG. 5(d), which better illustrates the shape of the shift register with notch discontinuities 512 and MTJ read element 516.

Figure 5D:
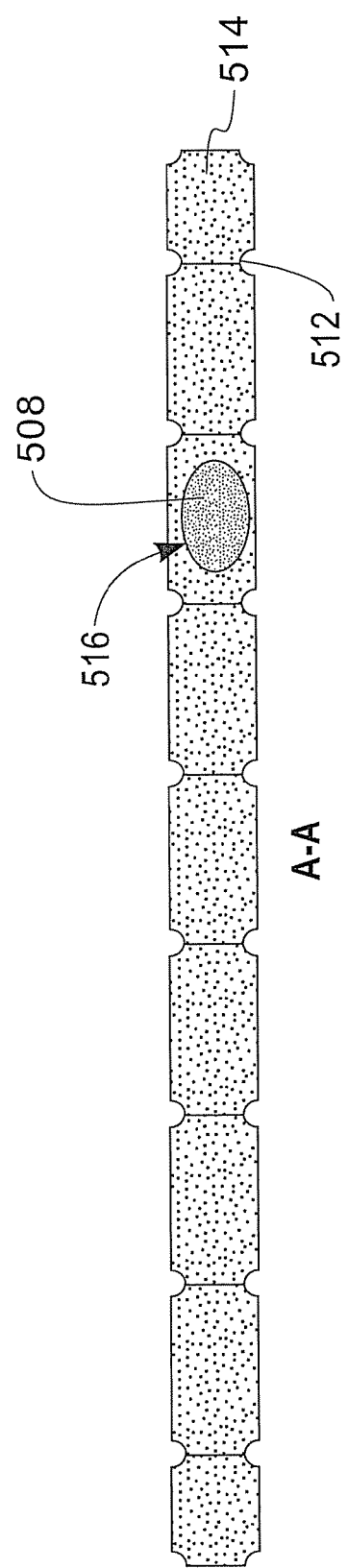
Figure 5E:
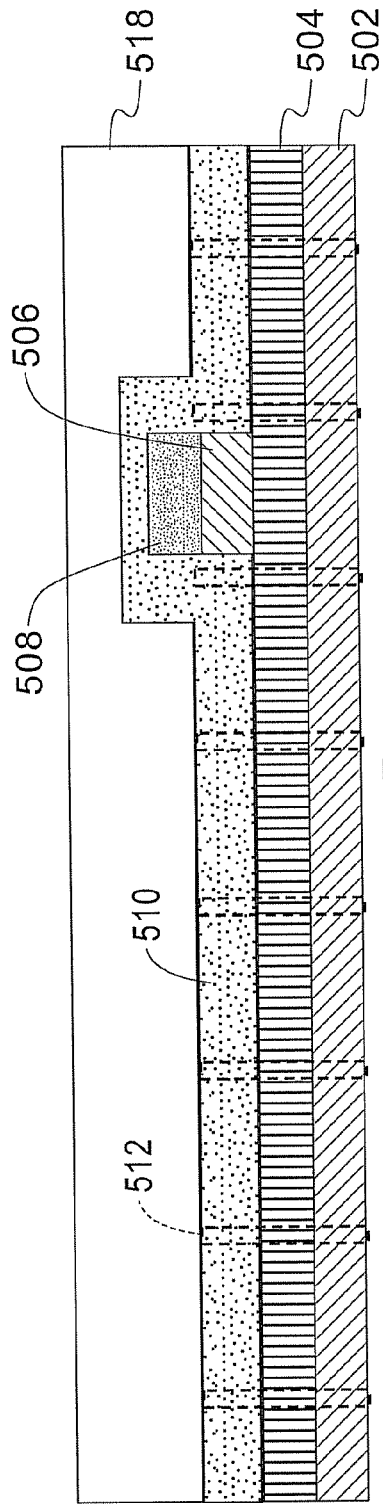
Figure 5F:
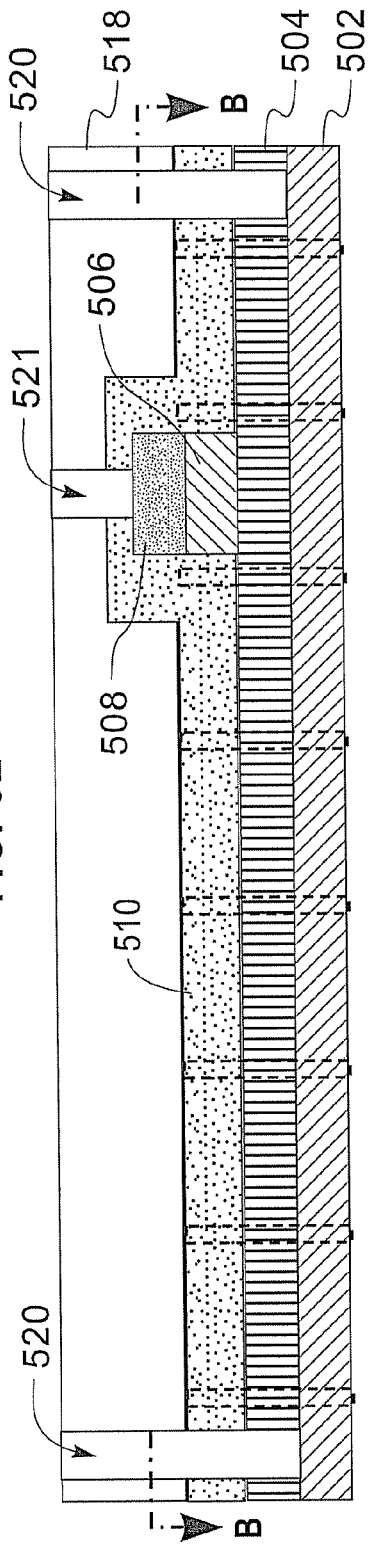
Figure 5G:
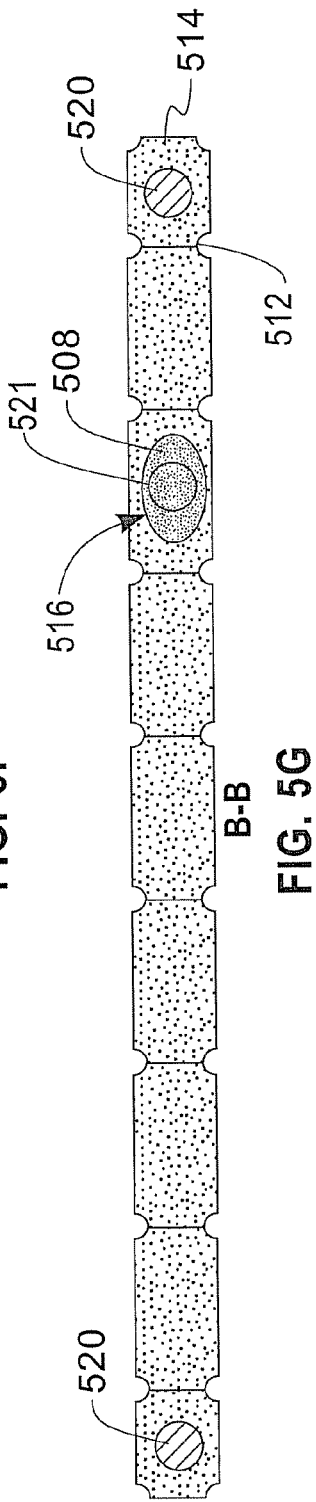

Referring next to FIG. 5(e), an interlevel dielectric layer 518 is formed and planarized over the structure of FIG. 5(d), in preparation of contact formation to the ends of the shift register 514 and MTJ read element 516. In FIG. 5(f), vias 520 are opened at opposite ends of the shift register, stopping on the free layer 502. Another via 521 is formed so as to stop on the cap layer 508 of the MTJ element. A top view taken along the arrows in FIG. 5(f) is shown in FIG. 5(g).

Figure 5H:
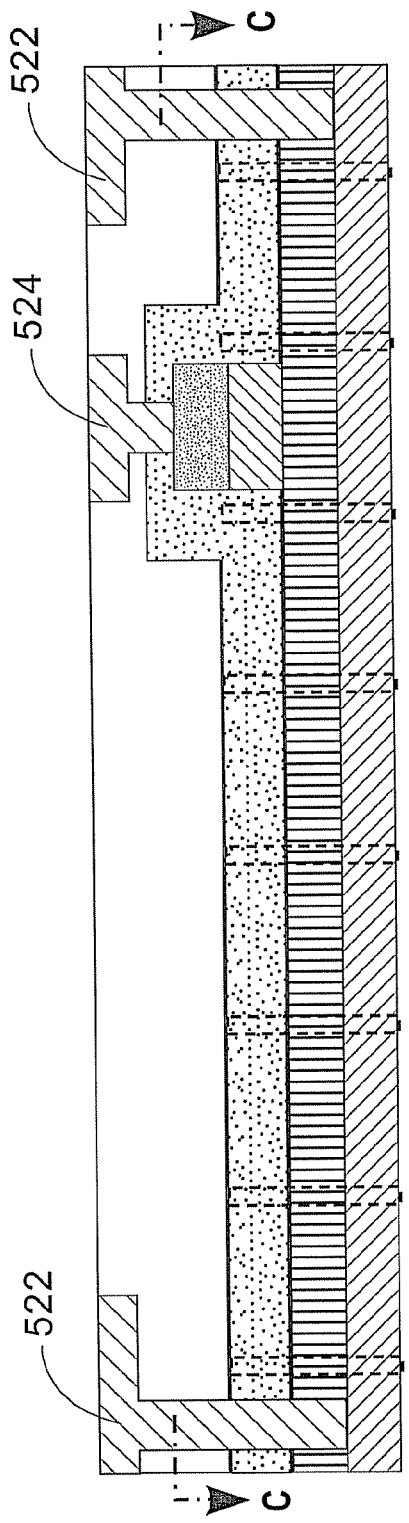
Figure 5I:
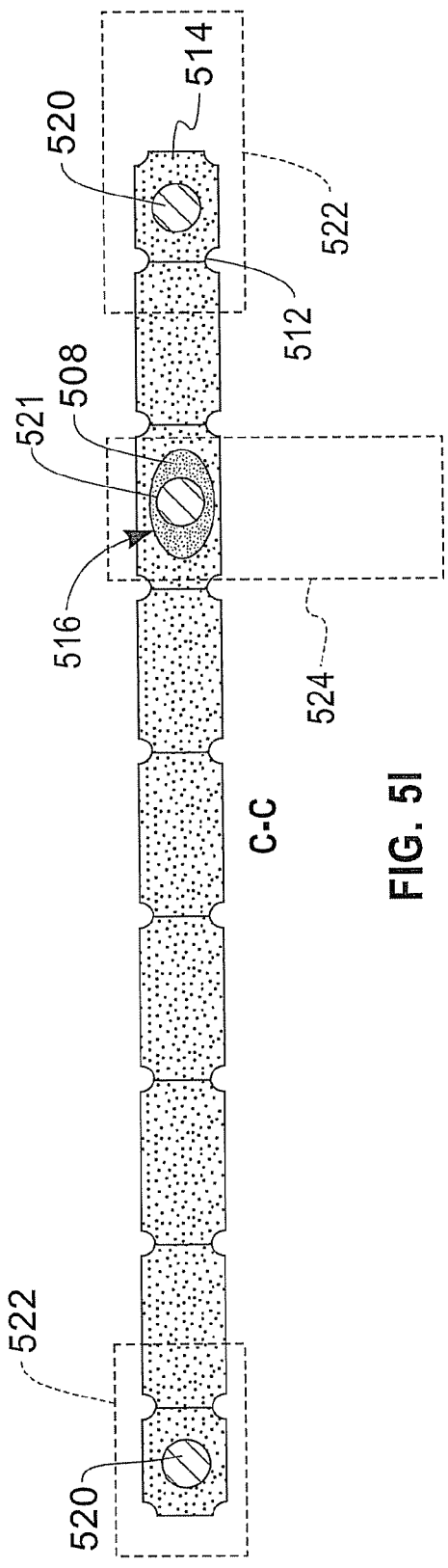

Proceeding to FIG. 5(h), a trench etch is performed in accordance with dual damascene processing techniques, followed by conductive metal fill so as to form shift current wires 522 and read wire 524. FIG. 5(i) is a top view along the arrows of FIG. 5(h). Again, it will be noted that the write wires, formed below the free layer 502 are not illustrated in the FIG. 5 sequence.

Figure 6:
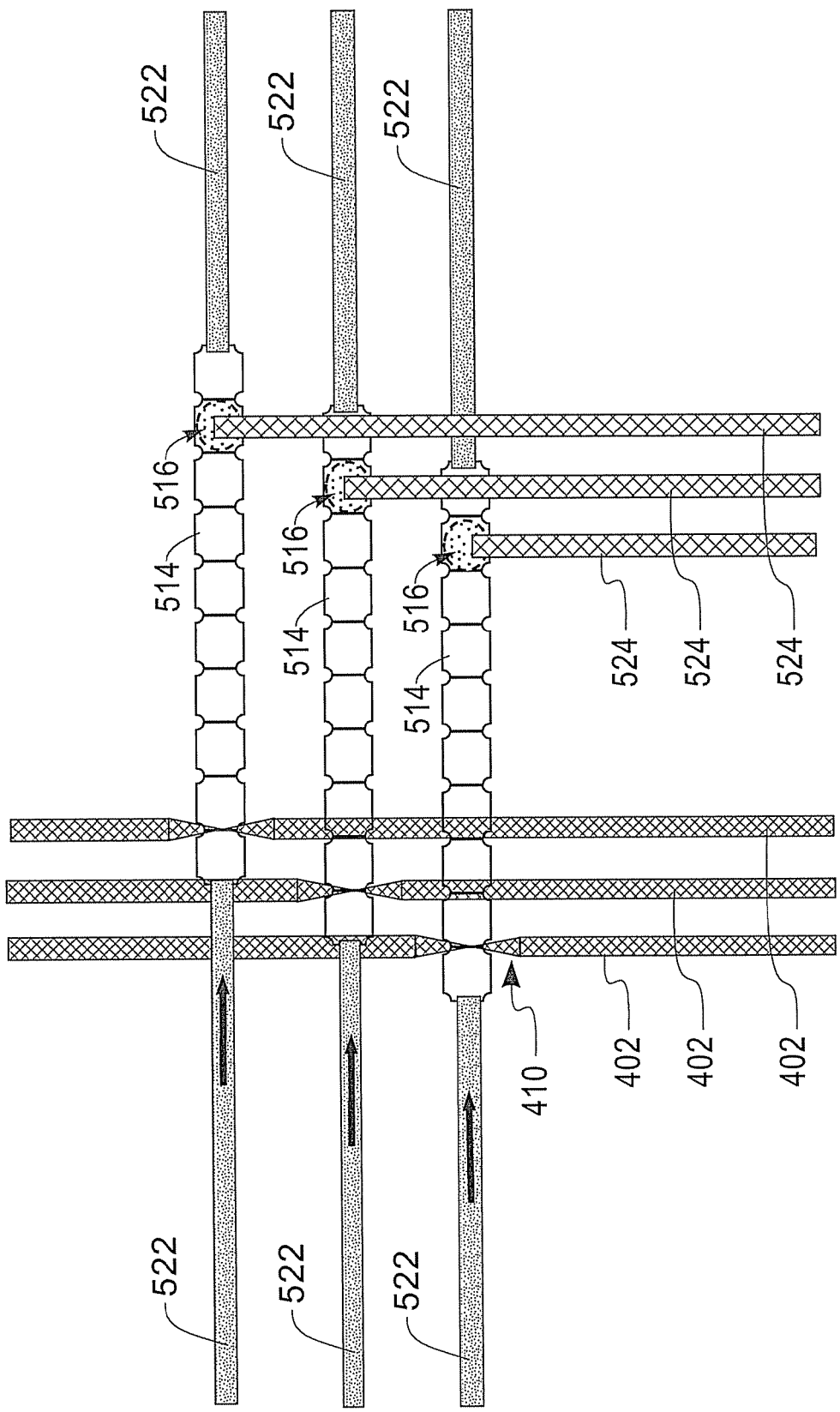
FIG. 6 is a schematic top view of an exemplary high-density, planar magnetic domain wall memory device comprising multiple, co-planar shift registers in accordance with a further embodiment of the invention.

FIG. 6 is a top-down view illustrating the staggering of several co-planar shift registers 514 for dense packing of memory elements on a planar surface with individual write wires assigned to each shift register element. As can be seen, the write wires 402 (with constrictions 410) are disposed at one end of the shift registers 514, while the MTJ elements 516 and associated read wires 524 are disposed at the other end of the registers 514. It should be appreciated that although the write wires 402 are shown as being formed below the shift registers 514 and the MTJ read elements 516 as being formed above the shift registers, other arrangements are also contemplated.

For example, the MTJ read elements 516 might be formed below the shift register 514, or even adjacent to (i.e., in the same plane as) the shift register 514. Likewise, the location of the write wire 402 and constrictions 410 may be above the shift register 514, or disposed vertically with respect to the shift register 514. In other words, the write wire can be formed as a via which carries current vertically with respect to the wafer substrate.

In lieu of an MTJ read element 516, other read mechanisms, such as GMR (giant magnetoresistance) sensors may also be employed. Still other contemplated variations include, but are not limited to: enhanced write wire configurations, such as high-permeability field-focusing elements (also called ferromagnetic field concentrators), and nonlinear shift registers, such as those including a curve, bend or other nonlinear shape within a circuit plane.

Figure 7:
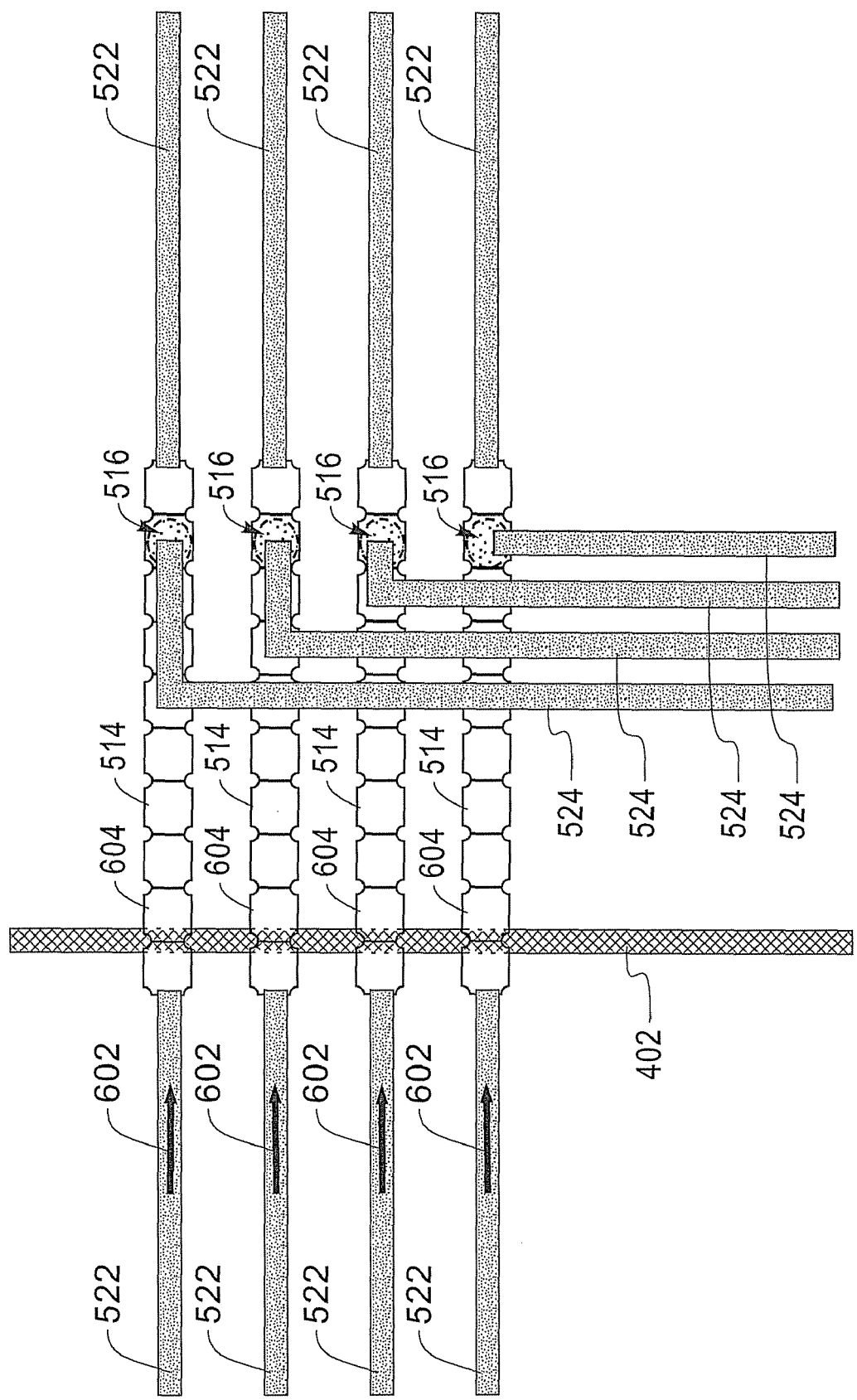
FIG. 7 is a schematic top view of an exemplary high-density, planar magnetic domain wall memory device having a compact write apparatus, in accordance with still another embodiment of the invention.

Referring now to FIG. 7, there is shown a top-down view illustrating an alternative embodiment of several co-planar shift registers 514 for dense packing of memory elements. In the embodiment illustrated, the need for staggering of the shift register elements 516 is eliminated. In one implementation of the structure shown in FIG. 7, a single common write wire 402 is associated with several shift register elements 516. Depending on the current drive capability of the circuit, a constriction (e.g., element 410 of FIG. 6) could be used beneath each shift register element, or (as specifically shown in FIG. 7) a simple straight write wire 402 could be employed. In either instance, the alignment of the multiple co-planar shift registers 514 results in the modified configuration of the read wires 524 as shown in FIG. 7. For example, the rightmost read wire corresponding to the bottom shift register 514 is substantially straight while the read wires corresponding to successively higher shift registers become more L-shaped. Other read wire configurations, however, are also contemplated.

With regard to writing a desired bit to a selected shift register(s) 514 using the single write wire configuration of FIG. 7, a confluence of two mechanisms is utilized: (1) a write current (along wire 402) of desired directionality used to define the direction of the bit's magnetization, and (2) a shift current (represented by arrow 602) applied only along the desired shift register(s), to "enter" the bit into position on the shift register's leftmost active storage cell 604. Write currents along write wire 402 without an associated shift current 602 would not result in the switching the state of cell 604, and thus will not affect the storage state of the shift registers. The element to the left of cell 604 is intended as a dummy (non-storage) element to facilitate reliable writing by spacing the shift register end a desired distance away from the edge of the write wire 402.

Figure 8:
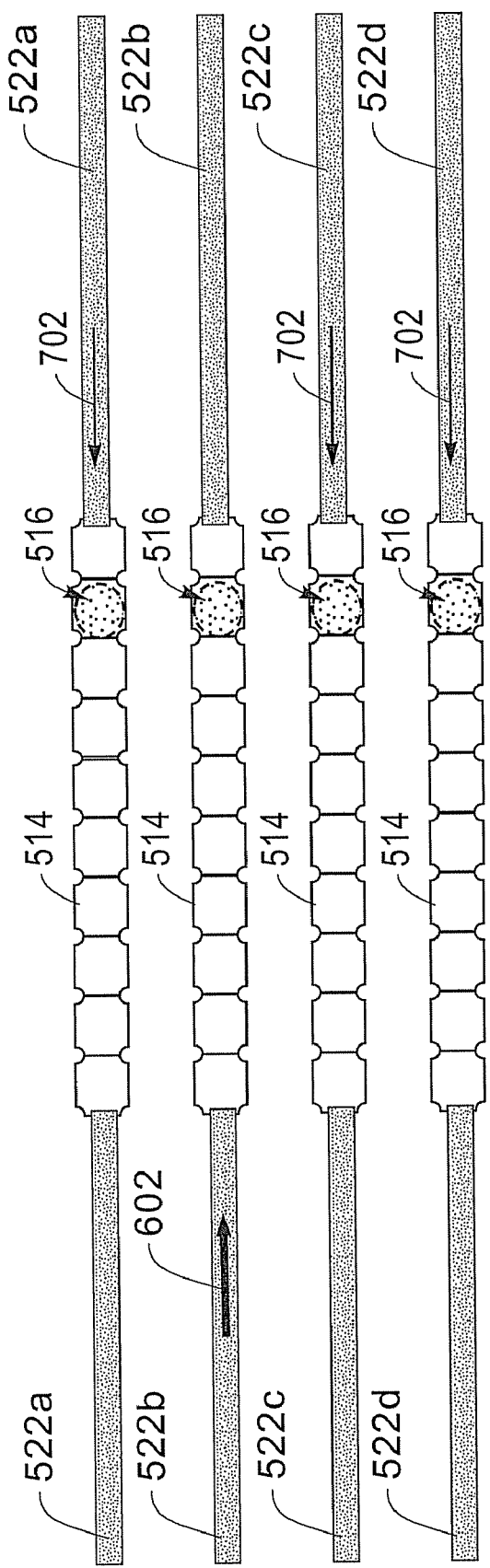
FIG. 8 schematically depicts an exemplary writing method of reducing failures from electromigration in shift register domain wall memory, in accordance with a further embodiment of the invention.

It is known in the art that a relatively large current density is required for shift currents 602 to effectively shift the domain walls along the shift register element. Unipolar operation, in which bits are always shifted in the same direction, is favored for simplicity and packing density. However, in combination with high current density shifting, such operation can lead to device failure over time through electromigration. Accordingly, FIG. 8 depicts an exemplary scheme for reducing device failure due to electromigration by using non-shifting registers as return current paths for the shift current in actively shifting registers. Because shifting of the domain walls requires current above a certain threshold, current below that threshold level may be passed through a shift register without shifting the domain walls. Accordingly, by splitting the return path of a given register's shift current 602 (e.g., through wire 522b) into multiple register currents 702 (e.g., through wires 522a, 522c, 522d), the register with supplied with current 602 is shifted while, at the same time, not shifting any registers with reduced current 702. The use of the return current in this manner will counteract electromigration for increased device lifetime.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A magnetic domain wall memory apparatus with write/read capability, comprising:
    a plurality of coplanar shift register structures each comprising an elongated track formed from a ferromagnetic material having a plurality of magnetic domains therein, the shift register structures further having a plurality of discontinuities therein to facilitate domain wall location;
    a magnetic read element associated with each of the shift register structures; and
    a magnetic write element associated with each of the shift register structures, the magnetic write element further comprising a single common write wire having a longitudinal axis substantially orthogonal to a longitudinal axis of each of the coplanar shift register structures.

2. The apparatus of claim 1, wherein ends of each shift register structure are aligned with one another.

3. The apparatus of claim 2, wherein the write wire includes a plurality of constrictions therein, the constrictions located at a point corresponding to the location of one of the plurality of discontinuities in the each of the associated shift register structures.

4. The apparatus of claim 1, wherein:
    the write wire is located proximate a first end of the shift register structures, and each read element is located proximate a second end thereof; and
    an endmost of the read elements is substantially straight and the remaining read elements are substantially L-shaped.

5. The apparatus of claim 1, further comprising:
    a plurality of shift current wires associated with each of the shift register structures;
    wherein the plurality of shift current wires are configured such that the shift current wires corresponding to unselected shift registers act as a current return path for shift current passing through a selected shift register, the current return path being in an opposite direction with respect to the direction of the shift current.

6. The apparatus of claim 1, wherein each read element comprises a magnetic tunnel junction (MTJ).

7. The apparatus of claim 1, wherein the plurality of discontinuities in each track are defined by a plurality of vertical notches formed within the ferromagnetic material.

8. The apparatus of claim 1, wherein the plurality of discontinuities in each track are defined by physical overlapping of magnetic segments.

9. The apparatus of claim 1, wherein the plurality of discontinuities in each track are defined by using alternating types of magnetic materials in the track.

10. The apparatus of claim 1, wherein the plurality of discontinuities in each track are defined by different material thicknesses for adjacent domains.

* * * * *